(12) United States Patent
Yang et al.

(10) Patent No.: US 9,123,545 B2
(45) Date of Patent: Sep. 1, 2015

(54) SEMICONDUCTOR DEVICE WITH SINGLE-EVENT LATCH-UP PREVENTION CIRCUITRY

(71) Applicants: Jianan Yang, Austin, TX (US); James D. Burnett, Austin, TX (US); Brad J. Garni, Austin, TX (US); Thomas W. Liston, Austin, TX (US)

(72) Inventors: Jianan Yang, Austin, TX (US); James D. Burnett, Austin, TX (US); Brad J. Garni, Austin, TX (US); Thomas W. Liston, Austin, TX (US)

( * ) Notice: Subject to any disclaimer, the term of this patent is extended or adjusted under 35 U.S.C. 154(b) by 0 days.

(21) Appl. No.: 14/188,461

(22) Filed: Feb. 24, 2014

(65) Prior Publication Data

US 2014/0167102 A1     Jun. 19, 2014

Related U.S. Application Data

(62) Division of application No. 13/560,010, filed on Jul. 27, 2012, now Pat. No. 8,685,800.

(51) Int. Cl.
*H01L 29/66* (2006.01)
*H01L 27/06* (2006.01)
*H01L 27/092* (2006.01)

(52) U.S. Cl.
CPC ............ *H01L 27/06* (2013.01); *H01L 27/0921* (2013.01)

(58) Field of Classification Search
USPC .......... 257/133, 139, 147, 372, E27.063, 107, 257/E29.182
See application file for complete search history.

(56) References Cited

U.S. PATENT DOCUMENTS

2005/0237833 A1\* 10/2005 Byeon et al. .................. 365/203

\* cited by examiner

*Primary Examiner* — Timor Karimy
(74) *Attorney, Agent, or Firm* — Yudell Isidore PLLC

(57) ABSTRACT

A semiconductor device includes a parasitic silicon-controlled rectifier (SCR) and a first transistor. The parasitic SCR includes a parasitic pnp bipolar junction transistor (BJT) and a parasitic npn BJT. The first transistor is coupled between a first power supply node and an emitter of the parasitic pnp BJT. The first transistor includes a first terminal coupled to the first power supply node, a second terminal coupled to the emitter of the parasitic pnp BJT, and a control terminal. The first transistor is not positioned between a base of the pnp BJT and the first power supply node. The first transistor limits current conducted by the parasitic pnp BJT following a single-event latch-up (SEL) event.

18 Claims, 8 Drawing Sheets

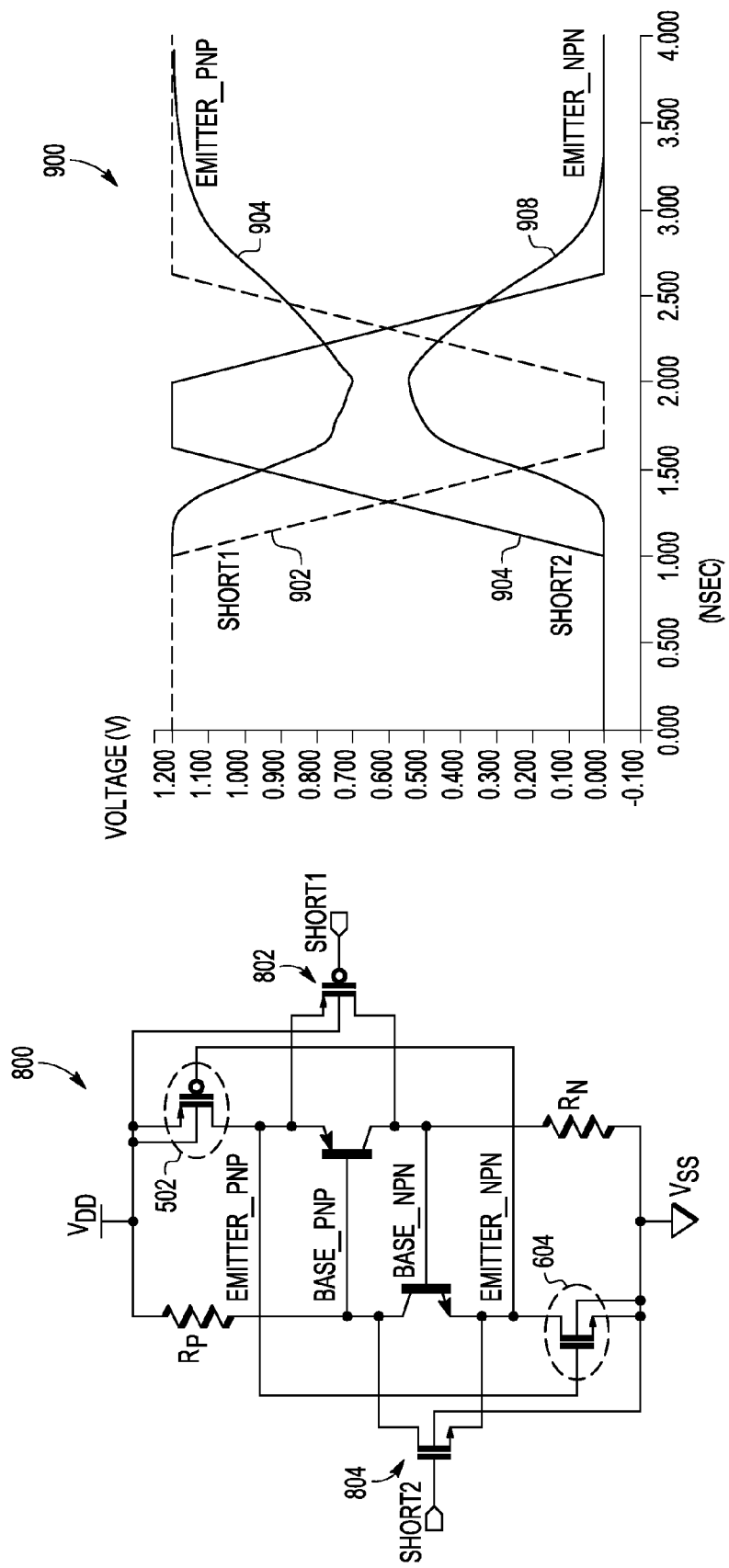

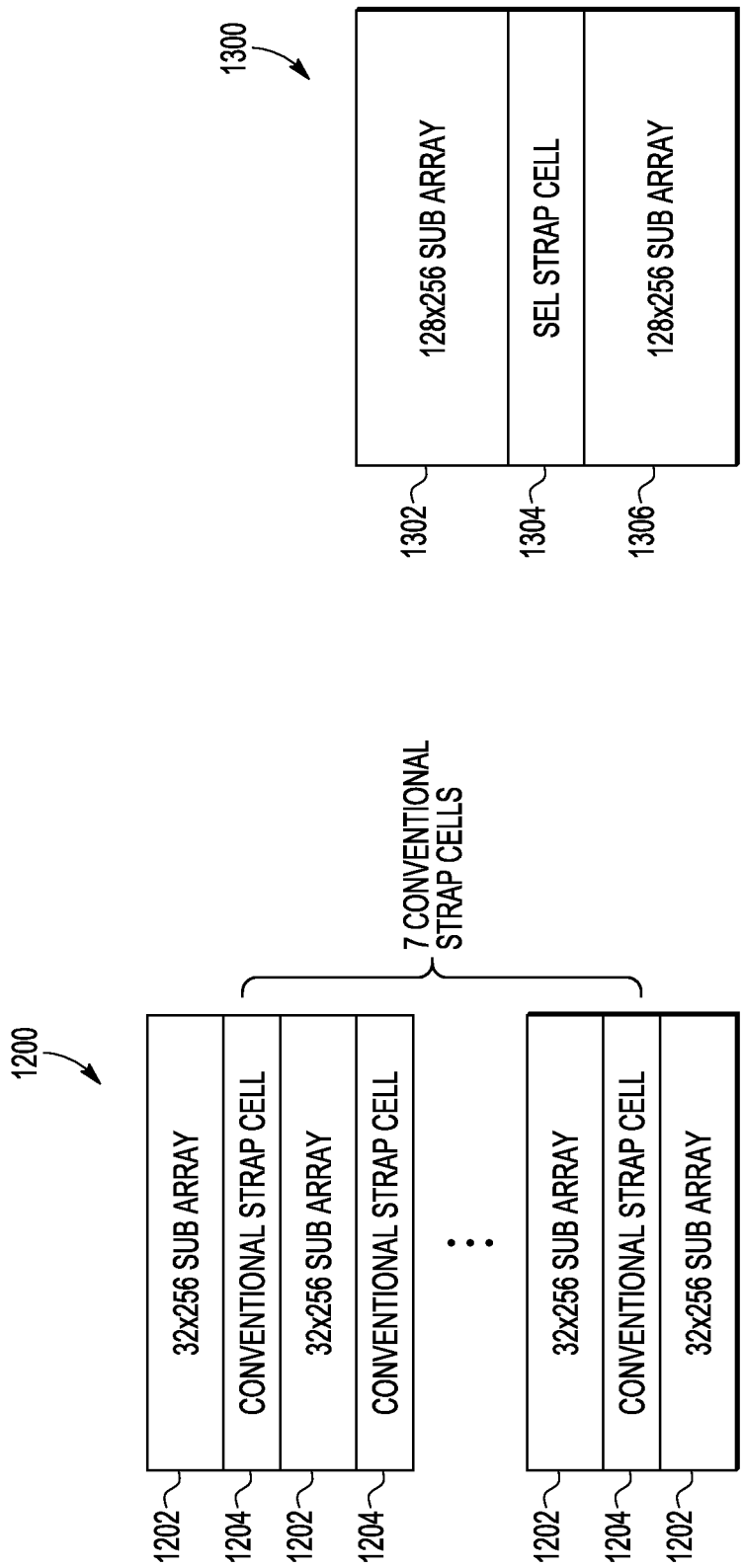

SEMICONDUCTOR DEVICE WITH SINGLE-EVENT LATCH-UP PREVENTION CIRCUITRY

This application is a divisional of U.S. patent application Ser. No. 13/560,010, entitled "SINGLE-EVENT LATCH-UP PREVENTION TECHNIQUES FOR A SEMICONDUCTOR DEVICE," filed on Jul. 27, 2012, the disclosure of which is hereby incorporated herein by reference in its entirety for all purposes.

BACKGROUND

1. Field

This disclosure relates generally to single-event latch-up and, more specifically, to techniques for preventing single-event latch-up of a semiconductor device.

2. Related Art

A single-event upset (SEU) is a change of state caused by ions or electromagnetic radiation striking a sensitive node in a semiconductor device, such as a node in a microprocessor, memory, or power transistor. In general, the state change is a result of free charge created by ionization in or close to a sensitive node of a logic element (e.g., a node of a memory bit cell). The error in semiconductor device output or operation due to a high energy particle strike is often referred to as a soft error upset or SEU.

Typically, an SEU has not permanently damaged functionality of a semiconductor device. In contrast, a single-event latch-up (SEL), a single-event gate rupture (SEGR), and/or a single-event burnout (SEB) may permanently damage a semiconductor device. An SEL may, for example, be attributed to parasitic circuit elements that form a silicon-controlled rectifier (SCR) in a semiconductor device. During an SEL, an SEL induced current may destroy components of a semiconductor device if the SEL induced current is not limited and promptly removed. In general, removal of power to a semiconductor device has been required in response to all non-catastrophic SEL events, in order to recover operations of the semiconductor device.

Terrestrial SEUs may occur due to cosmic particles colliding with atoms in the atmosphere, creating cascades or showers of neutrons and protons, which in turn may interact with circuits of a semiconductor device. At sub-micron geometries, SEUs may adversely affect semiconductor devices in the atmosphere. In space, high energy particles exist as part of the natural background. Solar particle events and high energy protons trapped in the magnetosphere of the Earth may also lead to SEUs. Secondary atmospheric neutrons generated by cosmic rays can also reach energy levels that are capable of producing SELs in avionic electronics on flights over the poles or at high altitude. Trace amounts of radioactive elements in integrated circuit (chip) packages may also cause SELs. In order to prevent latch-up in space applications, electronic devices may employ epitaxial substrate, silicon-on-insulator (SOI), or silicon-on-sapphire (SOS) technologies to reduce or eliminate SEL susceptibility, albeit at increased cost.

In semiconductor devices that utilize complementary metal-oxide semiconductor (CMOS) technology there are a number of parasitic npn and pnp bipolar junction transistors (BJTs) that may be formed from the combination of source/drain regions, n-type wells, p-type wells, and substrates utilized in CMOS technology. The parasitic BJT devices may create problems when triggered. For example, triggering the parasitic BJT devices may lead to shorting power (VDD) and ground (VSS) lines, which may result in destruction of an associated chip or an associated electronic system failure that can only be resolved by power-down.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

FIG. 8 is a schematic of a parasitic SCR that includes current limiters constructed according to FIG. 6, with additional circuitry that is employed to simulate an SEL.

FIG. 9 is a simulation graph depicting emitter voltages for parasitic bipolar junction transistors (BJTs) of the parasitic SCR of FIG. 8, when the additional circuitry is utilized to short the parasitic BJTs.

FIG. 12 is a floorplan view of a relevant portion of a conventional 256-by-256 memory array that includes seven conventional strap cells.

FIG. 13 is a floorplan view of a relevant portion of a 256-by-256 memory array that includes a single SEL strap cell configured according to one or more embodiments of the present invention.

DETAILED DESCRIPTION

Figure 3:
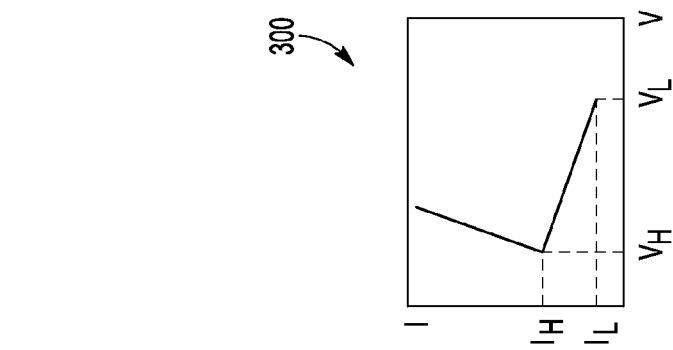
FIG. 3 is a graph depicting an SEL caused by a high energy particle striking the parasitic SCR of FIG. 2.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims and their equivalents. As may be used herein, the term 'coupled' includes a direct electrical connection between elements or components and an indirect electrical connection between elements or components achieved using one or more intervening elements or components.

The present disclosure is generally directed to single-event latch-up (SEL) prevention techniques and, more specifically, to an SEL current limiter or limiters for a complementary metal-oxide semiconductor (CMOS) device. While the discussion herein focuses on memory that includes CMOS devices, it is contemplated that the techniques disclosed herein are broadly applicable to other CMOS devices and are applicable to other technologies that experience SEL. As noted above, parasitic bipolar junction transistors (BJTs) that may be formed in bulk CMOS technology may cause an SEL when triggered by high energy particles. For CMOS memory, an SEL may destroy the device or corrupt stored data. As semiconductor device dimensions decrease and semiconductor device density increases, SELs are becoming more prevalent. According to aspects of the present disclosure, SEL prevention techniques are employed that are area efficient, decrease the probability of latch-up, and when latch-up does occur facilitate recovery from the latch-up condition.

According to one or more aspects of the present disclosure, a technique for addressing single-event latch-up (SEL) in a semiconductor device includes determining a location of a parasitic silicon-controlled rectifier (SCR) in an integrated circuit design of the semiconductor device. In this case, the parasitic SCR includes a parasitic pnp bipolar junction transistor (BJT) and a parasitic npn BJT. The technique also includes incorporating a first transistor (e.g., a pMOS) between a first power supply node (e.g., VDD) and an emitter of the parasitic pnp BJT in the integrated circuit design. The first transistor (pMOS) includes a first terminal (e.g., a source) coupled to the first power supply node, a second terminal (e.g., a drain) coupled to the emitter of the parasitic pnp BJT, and a control terminal (e.g., a gate). The first transistor is not positioned between a base of the pnp BJT and the first power supply node.

According to another aspect of the present disclosure, the technique further includes incorporating a second transistor (e.g., an nMOS) between a second power supply node (e.g., VSS) and an emitter of the parasitic npn BJT in the integrated circuit design. The second transistor includes a first terminal (e.g., a source) coupled to the second power supply node, a second terminal (e.g., a drain) coupled to the emitter of the parasitic npn BJT, and a control terminal (e.g., a gate). The control terminal of the first transistor is coupled to the emitter of the parasitic npn BJT and the control terminal of the second transistor is coupled to the emitter of the parasitic pnp BJT. The second transistor is not positioned between a base of the npn BJT and the second power supply node.

Figure 2:
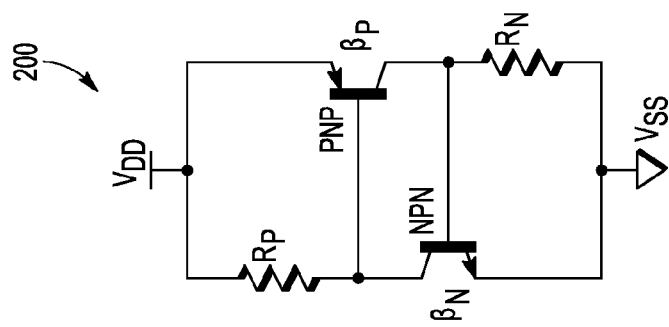
FIG. 2 is a schematic of the parasitic SCR of FIG. 1.
Figure 1:
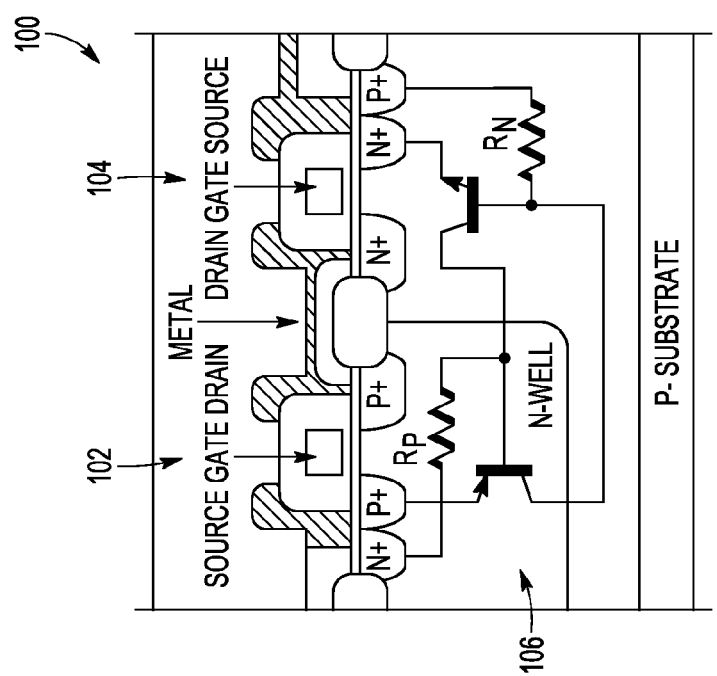
FIG. 1 is a cross-sectional view of a relevant portion of a complementary metal-oxide semiconductor (CMOS) device, which schematically depicts the location of components of a parasitic silicon controlled rectifier (SCR) that may lead to single-event latch-up (SEL) of the CMOS device.

With reference to FIG. 1, a cross-sectional view of a relevant portion of an exemplary complementary metal-oxide semiconductor (CMOS) device 100 is depicted that schematically illustrates the location of components of a parasitic silicon-controlled rectifier (SCR) 106 that may lead to single-event latch-up (SEL) for the device 100 responsive to a high energy particle strike. The device 100 includes a p-channel metal-oxide semiconductor field-effect transistor (MOSFET) 102 (formed in an n-type well on a p-type substrate) and an n-channel MOSFET 104 (formed in a p-type well or p-type substrate). The depicted components of the device 100 are well known and, for the sake of brevity, are not further discussed herein. With reference to FIG. 2, a schematic of the parasitic SCR 106 is further illustrated with respect to a first power supply node (VDD) and a second power supply node (VSS) or ground. With reference to FIG. 3, a graph 300 depicts an SEL caused by a high energy particle striking a node of the parasitic SCR 106 of FIG. 2. That is, when a high energy particle strike produces $I>I_L$, $\beta_n\beta_p>1$, and $VDD>V_H$ latch-up of the parasitic SCR 106 occurs. It should be appreciated that latch-up becomes more problematic as device geometry is decreased, as VDD becomes greater than $V_H$. While an epitaxial layer may be added on a substrate to lower $R_n$ and increase a latch-up threshold, the addition of an epitaxial layer leads to increased device cost and may lead to other undesired properties.

Figure 4:
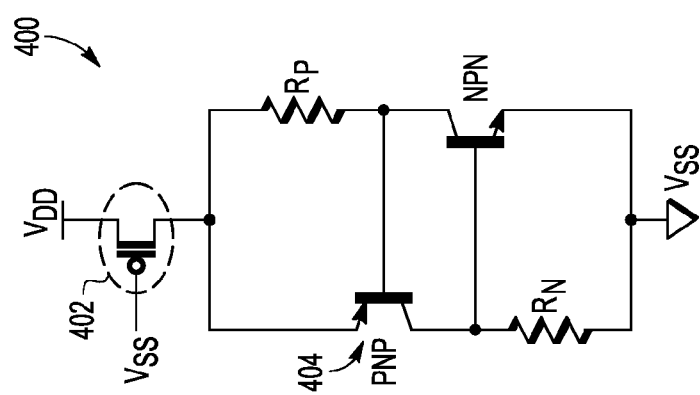
FIG. 4 is a schematic of a conventional current limiter that has been employed to reduce the effects of an SEL caused by the parasitic SCR of FIG. 1.

With reference to FIG. 4, to address SEL associated with a parasitic SCR 400 that is formed in a CMOS device (not shown in FIG. 4), a conventional current limiter 402 has been added to limit both emitter and base current of a pnp parasitic BJT 404 of the SCR 400. While the limiter 402 works to some degree to reduce latch-up, the limiter 402 may not effectively prevent destruction of the CMOS device and is typically not capable of pulling the CMOS device out of latch-up.

Figure 5:
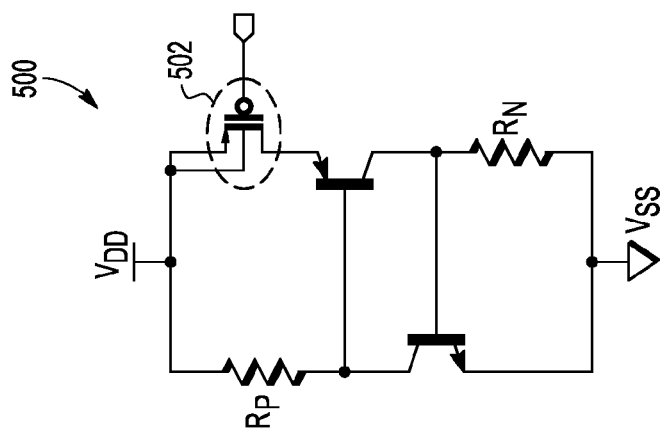
FIG. 5 is a schematic of a parasitic SCR that includes a current limiter that is employed to reduce SEL effects caused by the parasitic SCR in a CMOS device, according to one aspect of the present invention.

With reference to FIG. 5, a current limiter 502 is illustrated as being added to a parasitic SCR 500 to reduce latch-up associated with a high energy particle strike in a CMOS device (not shown in FIG. 5), according to one aspect of the present disclosure. It should be appreciated that the limiter 502 is added by incorporating the limiter 502 within the design of a CMOS device. It should be appreciated that the location of the parasitic SCR 500 may be determined manually (by a designer) during design of a CMOS device with an electronic design automation (EDA) tool. Alternatively, an EDA tool may be configured to locate parasitic SCRs within a CMOS device. According to this aspect, a source and n-type well (n-well) of an associated p-channel MOSFET (pMOS) are separated as the limiter 502 is only added to the drain of the pMOS (which is equivalent to the emitter of the parasitic pnp BJT) and the n-well (which is equivalent to a base of the parasitic pnp BJT) is coupled directly to VDD.

In general, the limiter 502 reduces forward bias of the emitter-base junction of the pnp BJT and, as such, prevents or interrupts a latch-up. Typically, implementing the limiter 502 makes a CMOS device (e.g., a CMOS memory bit cell) less prone to SEL and allows the CMOS device to recover from an SEL. It should be appreciated that in the current limiting approach of FIG. 5, only one current limiting pMOS is added at the emitter node of the parasitic pnp BJT. In general, the gate of the limiter 502 may be tied to VSS such that the limiter 502 is always on. Alternatively, the gate of the limiter 502 may be configured to receive a control signal that shuts the limiter 502 off following an SEL event and then turns the limiter 502 back on following a reset signal.

Figure 6:
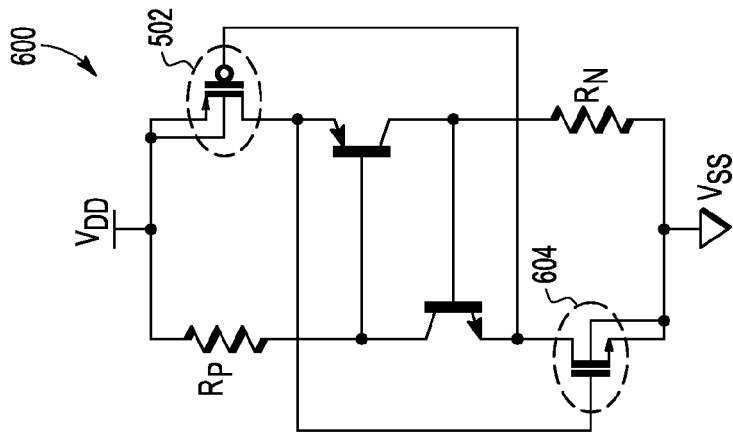
FIG. 6 is a schematic of a parasitic SCR that includes current limiters that are employed to reduce SEL effects caused by the parasitic SCR in a CMOS device, according to another aspect of the present invention.

With reference to FIG. 6, current limiters 502 and 604 are illustrated as being added to a parasitic SCR 600 to reduce latch-up associated with a high energy particle strike in an associated CMOS device (not shown in FIG. 6), according to another aspect of the present invention. It should be appreciated that the limiters 502 and 604 are added by incorporating the limiters 502 and 604 within the design of the CMOS device. As is illustrated in FIG. 6, the current limiter 502 is a pMOS that is added between an emitter of the parasitic pnp BJT and a first power supply node (VDD) and the current limiter 604 is an n-channel MOSFET (nMOS) that is added between the emitter of the parasitic npn BJT and ground (VSS). As is also illustrated, a gate of the limiter 604 is coupled to the emitter of the parasitic pnp BJT and a gate of the limiter 502 is coupled to the emitter of the parasitic npn BJT.

The current limiter 502 functions, as discussed above with respect to FIG. 5, to reduce forward bias of the emitter-base junction of the parasitic pnp BJT and, as such, prevents or interrupts latch-up associated with an SEL. Similarly, the current limiter 604 reduces forward bias of an emitter-base junction of the parasitic npn BJT and, as such, also functions to prevent or interrupt latch-up. In general, the two current limiter approach makes a CMOS device (e.g., a CMOS memory cell) even less prone to SEL (than the one current limiter approach of FIG. 5) and allows the CMOS device to recover even faster from an SEL.

Figure 7:
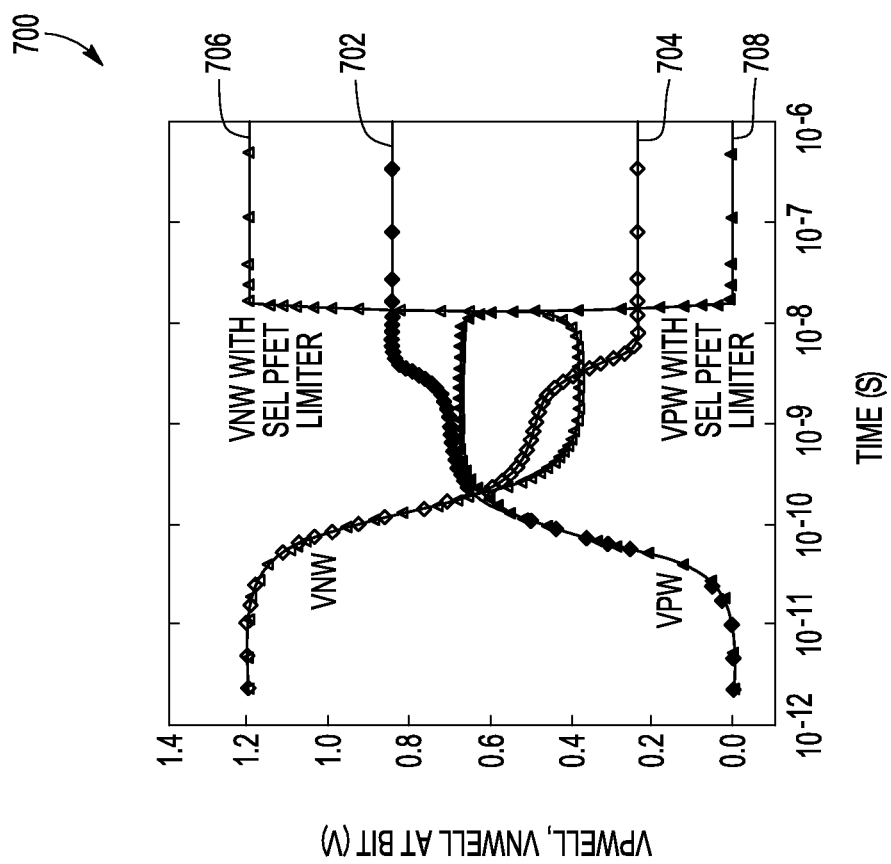
FIG. 7 is a simulation graph depicting an SEL caused by a high energy particle striking the parasitic SCR of FIGS. 4 and 5.

With reference to FIG. 7, a simulation graph 700 depicts an SEL caused by a high energy particle striking the parasitic SCR of FIGS. 4 and 5. Curve 706 depicts an n-well voltage and curve 708 depicts a p-type well (p-well) voltage when an SEL is simulated for the parasitic SCR 500 of FIG. 5. Curve 704 depicts an n-well voltage and curve 702 depicts a p-well voltage when an SEL is simulated for the parasitic SCR 400 of FIG. 4. With the pMOS limiter 502 added to the parasitic SCR 500 of FIG. 5, latch-up is avoided after a single-event high energy particle strike. In contrast, for the parasitic SCR 400 of FIG. 4 with the conventional limiter 402, latch-up occurs after a single-event high energy particle strike (i.e., the p-well voltage and n-well voltages do not return to their pre-strike levels).

With reference to FIG. 8, a parasitic SCR 800 is illustrated with the limiters 502 and 604 and additional circuitry (i.e., pMOS 802 and nMOS 804) that is implemented to simulate an SEL. When a latch-up event occurs, an emitter and collector of the parasitic pnp and npn BJTs are essentially shorted. For simulation purposes, the pMOS 802 and the nMOS 804 are coupled in parallel with the pnp and npn BJTs, respectively, to simulate a latch-up event when the pMOS 802 and the nMOS 804 are turned on. With reference to FIG. 9, a simulation graph 900 depicts emitter voltage curves 904 and 908 (that depict the emitter voltages for the parasitic BJTs of FIG. 8) when the pMOS 802 and the nMOS 804 are utilized to short the parasitic BJTs (see curves 902 and 904). As is illustrated in the graph 900, when latch-up occurs, the limiters 502 and 604 function to stop latch-up (which may destroy an associated CMOS device or cause a state change in a bit cell) and then pull internal nodes back to their original values. In the simulation, an ion strike may be simulated by pulling the base_pnp node voltage down to ground (worst case situation). From the graph 900, it should be appreciated that the parasitic BJTs respond with current spikes at various nodes, at which point the nodes are pulled back to their original levels (i.e., VDD and VSS or ground).

Figure 11:
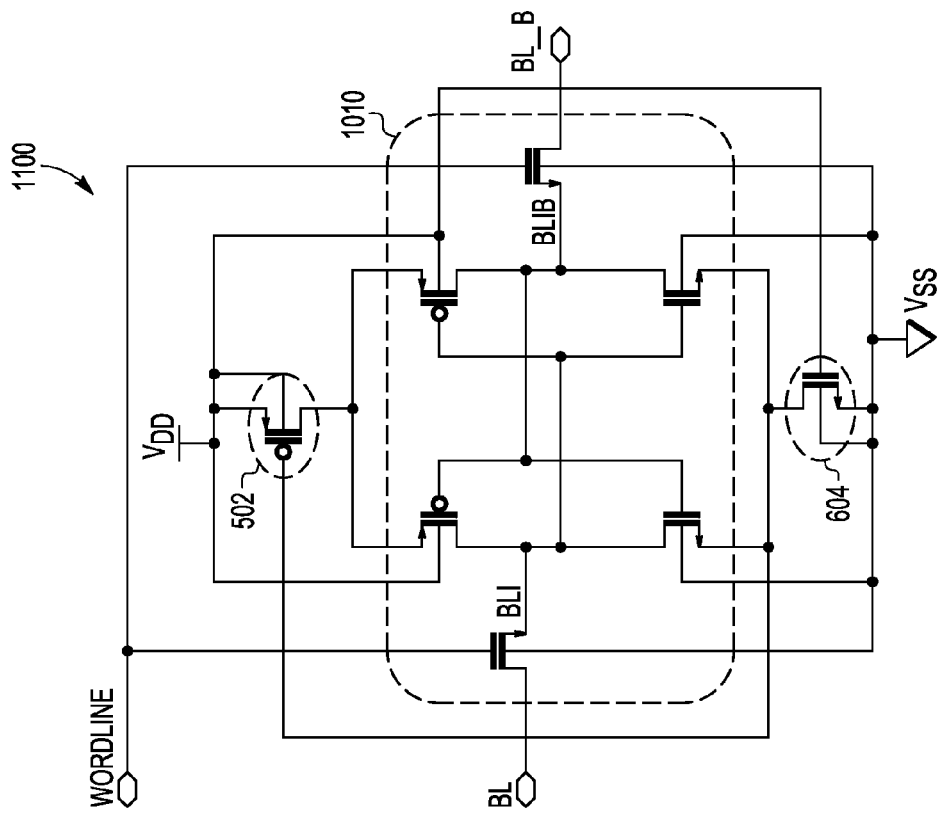
FIG. 11 is a schematic of the current limiters of FIG. 6 as implemented in conjunction with an SRAM bit cell.
Figure 10:
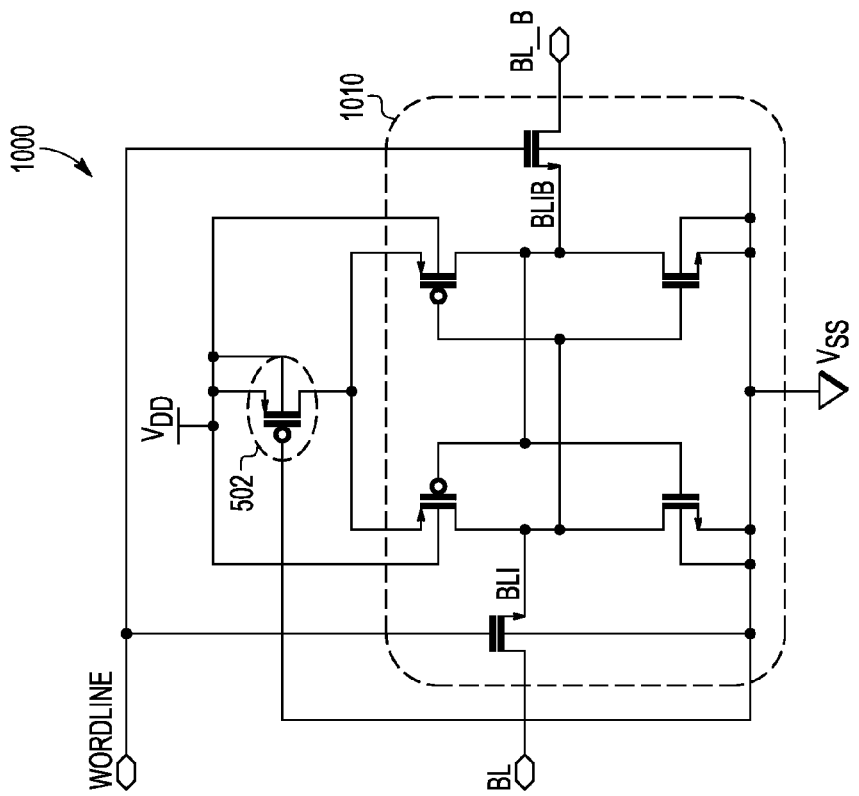
FIG. 10 is a schematic of the current limiter of FIG. 5 as implemented in conjunction with a static random access memory (SRAM) bit cell.

With reference to FIG. 10, an SEL protected static random access memory (SRAM) bit cell 1000 is illustrated that includes an SRAM bit cell 1010 that is protected from SEL by the current limiter 502 of FIG. 5 (for clarity the parasitic SCR is not shown in FIG. 10, see FIG. 1 for the location of the parasitic SCR in the CMOS device). As is shown, a gate of the limiter 502 is coupled to ground (VSS), a source and body of the limiter 502 are separately coupled to a power supply node (VDD), and a drain of the limiter 502 is coupled to high-side of the bit cell 1010. With reference to FIG. 11, an SEL protected SRAM bit cell 1100 is illustrated that includes the SRAM bit cell 1010 protected by the current limiters 502 and 604 of FIG. 6 (the parasitic SCR 600 is not shown in FIG. 11) positioned to address SEL. As is shown, a gate of the limiter 502 is coupled to ground (VSS), a source and body of the limiter 502 are separated coupled to a power supply node (VDD), and a drain of the limiter 502 is coupled to a high-side of the bit cell 1010. As is also depicted, a gate of the limiter 604 is coupled to the power supply node (VDD), a source and body of the limiter 604 are separately coupled to ground (VSS), and a drain of the limiter 604 is coupled to a low-side of the bit cell 1010.

Figure 14:
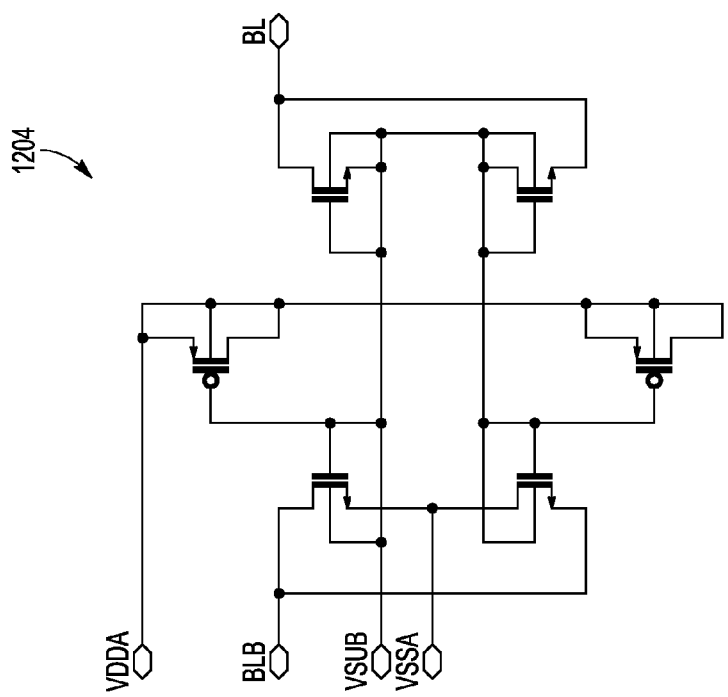
FIG. 14 is a schematic of a conventional strap cell.

With reference to FIG. 12, a conventional 256-by-256 memory array 1200 is illustrated that includes seven conventional strap cells 1204 (see FIG. 14) that are used to strap VDD and VSS for 32-by-256 sub arrays 1202 of the memory array 1200. In general, VDD and VSS are provided by long metal (e.g., copper or aluminum) lines that run across a memory array. The memory array 1200 is an example of a forty nanometer CMOS memory technology that implemented conventional strap cells 1204 every thirty-two rows to ensure that local VDD lines are maintained at a substantially similar potential (i.e., a power supply potential) and that local VSS lines are maintained at a substantially similar potential (i.e., ground).

Figure 15:
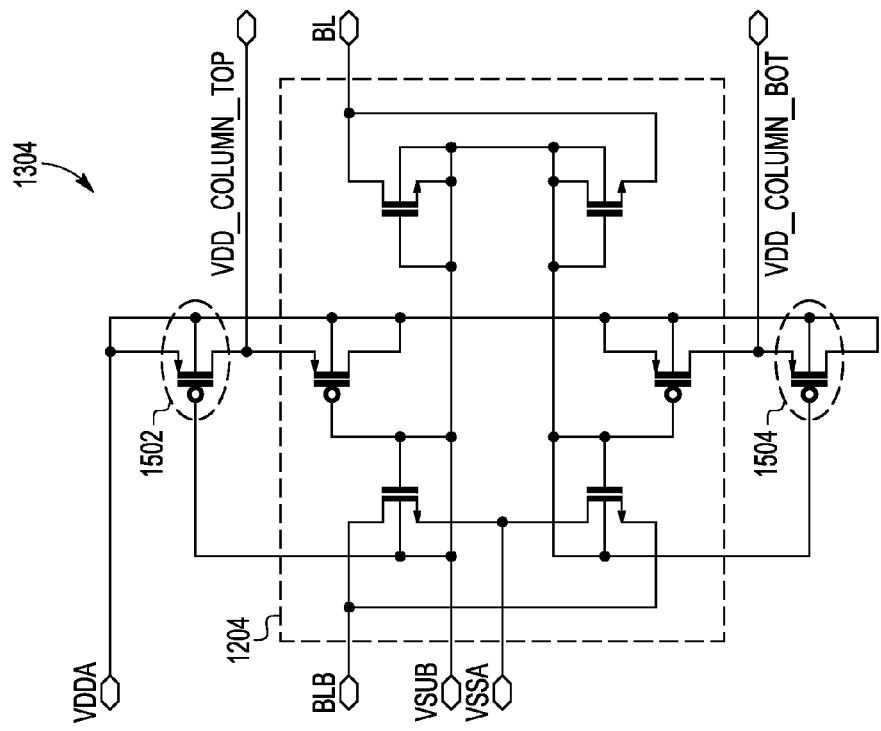
FIG. 15 is a schematic of an SEL strap cell configured according to one or more embodiments of the present invention.

With reference to FIG. 13, a relevant portion of a 256-by-256 memory array 1300 is illustrated that includes a single SEL strap cell 1304 (see FIG. 15) that is configured according to one or more embodiments of the present disclosure to couple power lines of an upper 128-by-256 sub array 1302 of the memory array 1300 to power lines of a lower 128-by-256 sub array 1306 of the memory array 1300. According to this aspect of the present disclosure, multiple of the limiters 502 (labeled as 1502 and 1504 in FIG. 15) are implemented within an SEL strap cell design to reduce the number of strap cells required to strap VDD and VSS. According to this aspect, the number of strap cells is decreased to one strap cell per two-hundred fifty-six rows. With reference to FIG. 15, a pMOS 1502 is utilized to couple a global VDD (vdda) to a local VDD (vdd_column_top) of the sub array 1302 and a pmos 1504 is utilized to couple the global VDD (vdda) to a local VDD (vdd_column_bot) of the sub array 1306. In general, for a 256-by-256 memory array, employing the SEL strap cell 1304 reduces an area for the memory array 1300 by about five percent, as compared to an area for the memory array 1200.

Figure 17:
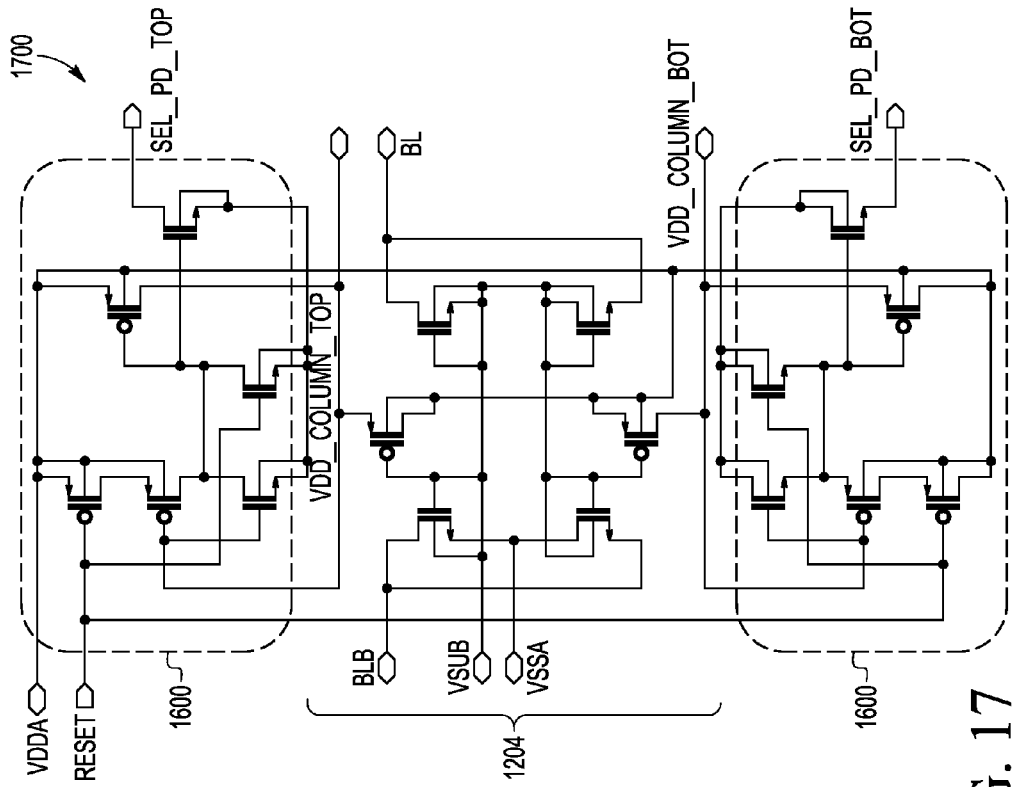
FIG. 17 is a schematic of a conventional strap cell with the resettable SEL detection circuits of FIG. 16 implemented at a top and bottom of the conventional strap cell according to one or more embodiments of the present invention.
Figure 16:
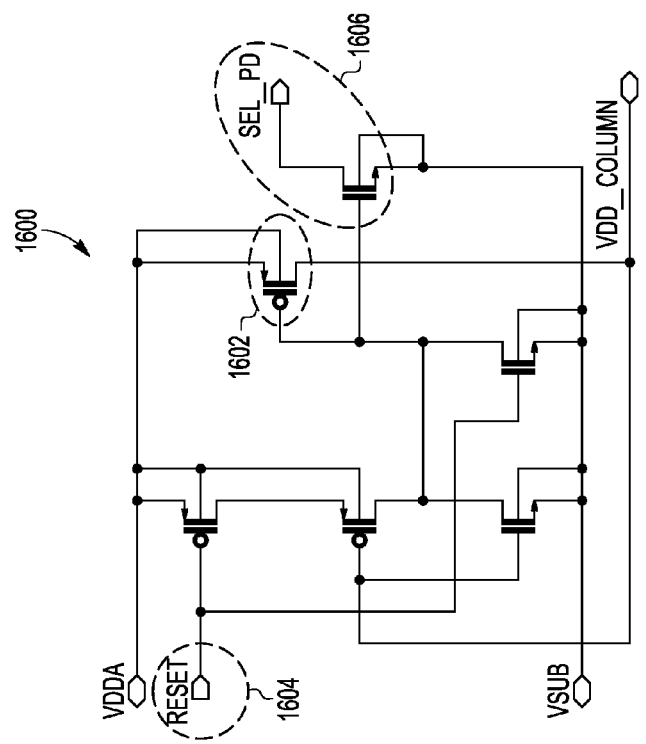
FIG. 16 is a schematic of a resettable SEL detection circuit configured according to one or more embodiments of the present invention.

With reference to FIG. 16, a resettable SEL detection circuit 1600 is illustrated that is configured according to one or more embodiments of the present invention. The circuit 1600 includes a pMOS 1602 that is added between a global VDD (vdda) and a local VDD (vdd_column) and is configured to receive a reset signal (reset) 1604 that facilitates resetting the circuit 1600 following latch-up event, as indicated by a generated output signal (sel_pd) 1606 for the local VDD (vdd_column). It should be noted that the pMOS 1602 is internally controlled and does not receive an external control signal. The pMOS 1602 functions to limit current associated with the parasitic SCR 500 (not shown in FIG. 16, see FIGS. 1 and 5) and prevent latch-up (see the current limiter 502 of FIG. 5). With reference to FIG. 17, a circuit 1700 includes the convention SEL strap cell 1204 with two of the resettable SEL detection circuits 1600 of FIG. 16 implemented at a top and bottom of the SEL strap cell 1204 according to one or more embodiments of the present disclosure.

Accordingly, techniques have been disclosed here that reduce the likelihood of a single-event latch-up when a node of a complementary metal-oxide semiconductor device experiences a high energy particle strike.

Although the invention is described herein with reference to specific embodiments, various modifications and changes can be made without departing from the scope of the present invention as set forth in the claims below. For example, the techniques disclosed herein are generally broadly applicable to systems that facilitate data communication. Accordingly, the specification and figures are to be regarded in an illustrative rather than a restrictive sense, and all such modifications are intended to be included with the scope of the present invention. Any benefits, advantages, or solution to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device, comprising:
   a parasitic silicon-controlled rectifier that includes a parasitic pnp bipolar junction transistor and a parasitic npn bipolar junction transistor;
   a first transistor coupled between a first power supply node and an emitter of the parasitic pnp bipolar junction transistor, wherein the first transistor includes a first terminal coupled to the first power supply node, a second terminal coupled to the emitter of the parasitic pnp bipolar junction transistor, and a control terminal, and wherein the first transistor is not positioned between a base of the pnp bipolar junction transistor and the first power supply node, where the first transistor limits current conducted by the parasitic pnp bipolar junction transistor following a single-event latch-up (SEL) and the control terminal of the first transistor is configured to receive a control signal that shuts the first transistor off following an SEL event and then turns the first transistor back on following a reset signal, and where the semiconductor device is a static random access memory (SRAM); and
   a second transistor coupled between a second power supply node and an emitter of the parasitic npn bipolar junction transistor, wherein the second transistor includes a first terminal coupled to the second power supply node, a second terminal coupled to the emitter of the parasitic npn bipolar junction transistor, and a control terminal, and wherein the control terminal of the first transistor is co coupled to the emitter of the parasitic npn bipolar junction transistor and the control terminal of the second transistor is coupled to the emitter of the parasitic pnp bipolar junction transistor, where the second transistor is not positioned between a base of the npn bipolar junction transistor and the second power supply node.

2. The semiconductor device of claim 1, wherein the first transistor is a p-channel metal-oxide semiconductor field-effect transistor and the second transistor is an n-channel metal-oxide semiconductor field-effect transistor, and wherein the first terminals of the first and second transistors correspond to respective source terminals of the first and second transistors, the second terminals of the first and second transistors correspond to respective drain terminals of the first and second transistors, and the control terminals of the first and second transistors correspond to respective gate terminals of the first and second transistors.

3. The semiconductor device of claim 1, wherein a body of the first transistor is coupled to the first power supply node.

4. The semiconductor device of claim 1, wherein a body of the second transistor is coupled to the second power supply node.

5. The semiconductor device of claim 1, wherein the first transistor is a p-channel metal-oxide semiconductor field-effect transistor and the first terminal of the first transistor corresponds to a source terminal, and wherein a body of the first transistor is coupled to the first power supply node using a connection that is separate from the first terminal.

6. The semiconductor device of claim 1, wherein the first power supply node is a global power supply node and the first transistor is positioned in a strap cell between the global power supply node and a local power supply node.

7. The semiconductor device of claim 6, further comprising:
   an SEL detection circuit that is configured to generate an SEL signal responsive to the SEL event.

8. The semiconductor device of claim 7, wherein the SEL detection circuit is further configured to be reset responsive to an external reset signal.

9. A semiconductor device, comprising:
   a parasitic silicon-controlled rectifier that includes a parasitic pnp bipolar junction transistor and a parasitic npn bipolar junction transistor;
   a first transistor coupled between a first power supply node and an emitter of the parasitic pnp bipolar junction transistor, wherein the first transistor includes a first terminal coupled to the first power supply node, a second terminal coupled to the emitter of the parasitic pnp bipolar junction transistor, and a control terminal, and wherein the first transistor is not positioned between a base of the pnp bipolar junction transistor and the first power supply node, where the first transistor limits current conducted by the parasitic pnp bipolar junction transistor following a single-event latch-up (SEL); and
   a second transistor coupled between a second power supply node and an emitter of the parasitic npn bipolar junction transistor, wherein the second transistor includes a first terminal coupled to the second power supply node, a second terminal coupled to the emitter of the parasitic npn bipolar junction transistor, and a control terminal, and wherein the control terminal of the first transistor is coupled to the emitter of the parasitic npn bipolar junction transistor and the control terminal of the second transistor is coupled to the emitter of the parasitic pnp bipolar junction transistor, where the second transistor is not positioned between a base of the npn bipolar junction transistor and the second power supply node.

10. The semiconductor device of claim 9, wherein the first transistor is a p-channel metal-oxide semiconductor field-effect transistor and the second transistor is an n-channel metal-oxide semiconductor field-effect transistor, and wherein the first terminals of the first and second transistors correspond to respective source terminals of the first and second transistors, the second terminals of the first and second transistors correspond to respective drain terminals of the first and second transistors, and the control terminals of the first and second transistors correspond to respective gate terminals of the first and second transistors.

11. The semiconductor device of claim 9, wherein a body of the first transistor is coupled to the first power supply node.

12. The semiconductor device of claim 9, wherein a body of the second transistor is coupled to the second power supply node.

13. The semiconductor device of claim 9, wherein the first transistor is a p-channel metal-oxide semiconductor field-effect transistor and the first terminal of the first transistor corresponds to a source terminal, and wherein a body of the first transistor is coupled to the first power supply node using a connection that is separate from the first terminal.

14. The semiconductor device of claim 9, wherein the semiconductor device is a static random access memory (SRAM), the first power supply node is a global power supply node, and the first transistor is positioned in a strap cell between the global power supply node and a local power supply node.

15. The semiconductor device of claim 14, further comprising:
   an SEL detection circuit that is configured to generate an SEL signal responsive to an SEL event.

16. The semiconductor device of claim 5, wherein the SEL detection circuit is further configured to be reset responsive to an external reset.

17. The semiconductor device of claim 9, when the control terminal of the first transistor is coupled to ground.

18. The semiconductor device of claim 9, when the control terminal of the first transistor is configured to receive a control signal that shuts the first transistor off following an SEL event and then turns the first transistor back on following a reset signal.

* * * * *